(12) United States Patent
Tseng et al.

(10) Patent No.: US 10,366,729 B2
(45) Date of Patent: Jul. 30, 2019

(54) SENSE CIRCUIT WITH TWO-STEP CLOCK SIGNAL FOR CONSECUTIVE SENSING

(71) Applicant: SanDisk Technologies LLC, Plano, TX (US)

(72) Inventors: Tai-Yuan Tseng, Milpitas, CA (US); Anirudh Amarnath, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/630,079

(22) Filed: Jun. 22, 2017

(65) Prior Publication Data

US 2018/0374518 A1    Dec. 27, 2018

(51) Int. Cl.
| | |
|---|---|
| *G11C 11/16* | (2006.01) |
| *G11C 7/08* | (2006.01) |
| *G11C 7/12* | (2006.01) |
| *G11C 16/26* | (2006.01) |
| *G11C 16/04* | (2006.01) |
| *G11C 16/34* | (2006.01) |
| *G11C 13/00* | (2006.01) |
| *G11C 11/56* | (2006.01) |
| *G11C 16/08* | (2006.01) |
| *G11C 16/32* | (2006.01) |

(52) U.S. Cl.
CPC ............ *G11C 7/08* (2013.01); *G11C 7/12* (2013.01); *G11C 11/1673* (2013.01); *G11C 16/0483* (2013.01); *G11C 16/26* (2013.01); *G11C 16/3459* (2013.01); *G11C 11/5628* (2013.01); *G11C 11/5642* (2013.01); *G11C 13/004* (2013.01); *G11C 13/0064* (2013.01); *G11C 16/08* (2013.01); *G11C 16/32* (2013.01); *G11C 2013/0042* (2013.01); *G11C 2213/71* (2013.01)

(58) Field of Classification Search
CPC . G11C 11/5642; G11C 16/26; G11C 16/3418; G11C 16/3422; G11C 16/28; G11C 16/10; G11C 7/08; G11C 7/02; G11C 7/12; G11C 7/06

See application file for complete search history.

(56) References Cited

U.S. PATENT DOCUMENTS

| | | |
|---|---|---|
| 5,175,450 A | 12/1992 | Chern |
| 7,508,721 B2 | 3/2009 | Li et al. |
| 7,515,476 B2 | 4/2009 | Park et al. |
| 7,616,036 B1 | 11/2009 | Tabatabaei |
| 7,957,197 B2 | 6/2011 | Nguyen et al. |

(Continued)

*Primary Examiner* — Hien N Nguyen
(74) *Attorney, Agent, or Firm* — Vierra Magen Marcus LLP

(57) ABSTRACT

A sense circuit is provided in which the threshold voltage of a memory cell is sensed relative to two different levels using a single control gate voltage on the memory cell. These two levels can be lower and higher verify voltages of a data state in a programming operation, or two read levels of a read operation. A sense node is charged up to a peak level by a pre-charge voltage and by capacitive coupling. The sense node then discharges into the bit line. The sense node voltage is decreased first and second times by capacitive coupling after which first and second bits of data are output based on a level of the sense node. The first and second bits indicate a level of the sense node relative to the lower and higher verify voltages, respectively.

20 Claims, 13 Drawing Sheets

(56) References Cited

U.S. PATENT DOCUMENTS

| | | | |
|---|---|---|---|
| 8,270,242 B2 * | 9/2012 | Fort | G11C 7/067 |
| | | | 365/185.21 |
| 9,165,664 B2 * | 10/2015 | D'Alessandro | G11C 16/26 |
| 9,293,195 B2 | 3/2016 | Mui et al. | |
| 9,299,449 B2 | 3/2016 | D' Alessandro et al. | |
| 9,349,468 B2 | 5/2016 | Louie et al. | |
| 9,552,882 B2 | 1/2017 | Tseng et al. | |
| 2006/0158935 A1 * | 7/2006 | Chan | G11C 7/062 |
| | | | 365/185.17 |
| 2014/0003153 A1 | 1/2014 | Mui et al. | |
| 2016/0351254 A1 | 12/2016 | Li et al. | |
| 2017/0076812 A1 | 3/2017 | Chu et al. | |

* cited by examiner

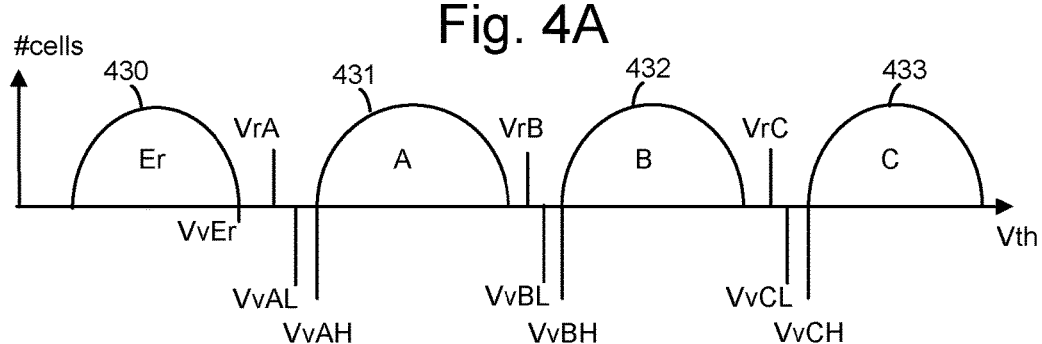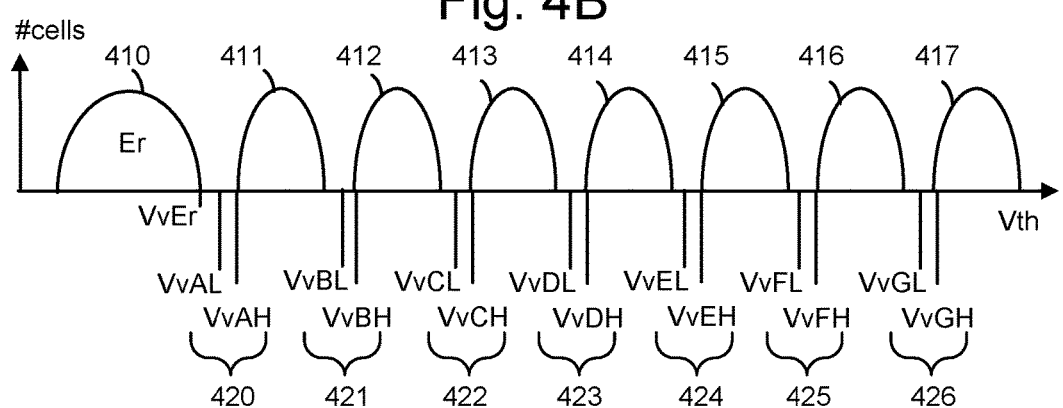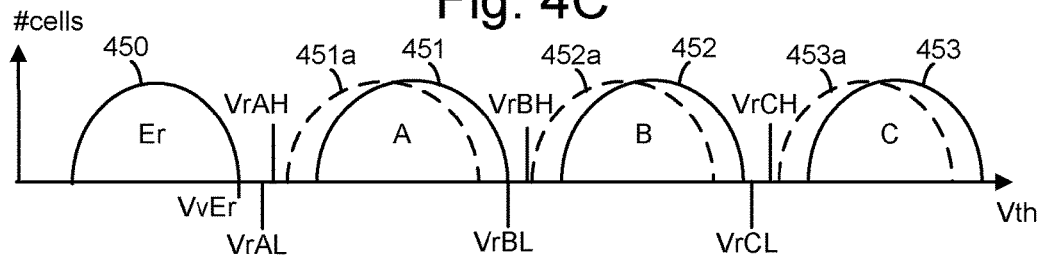

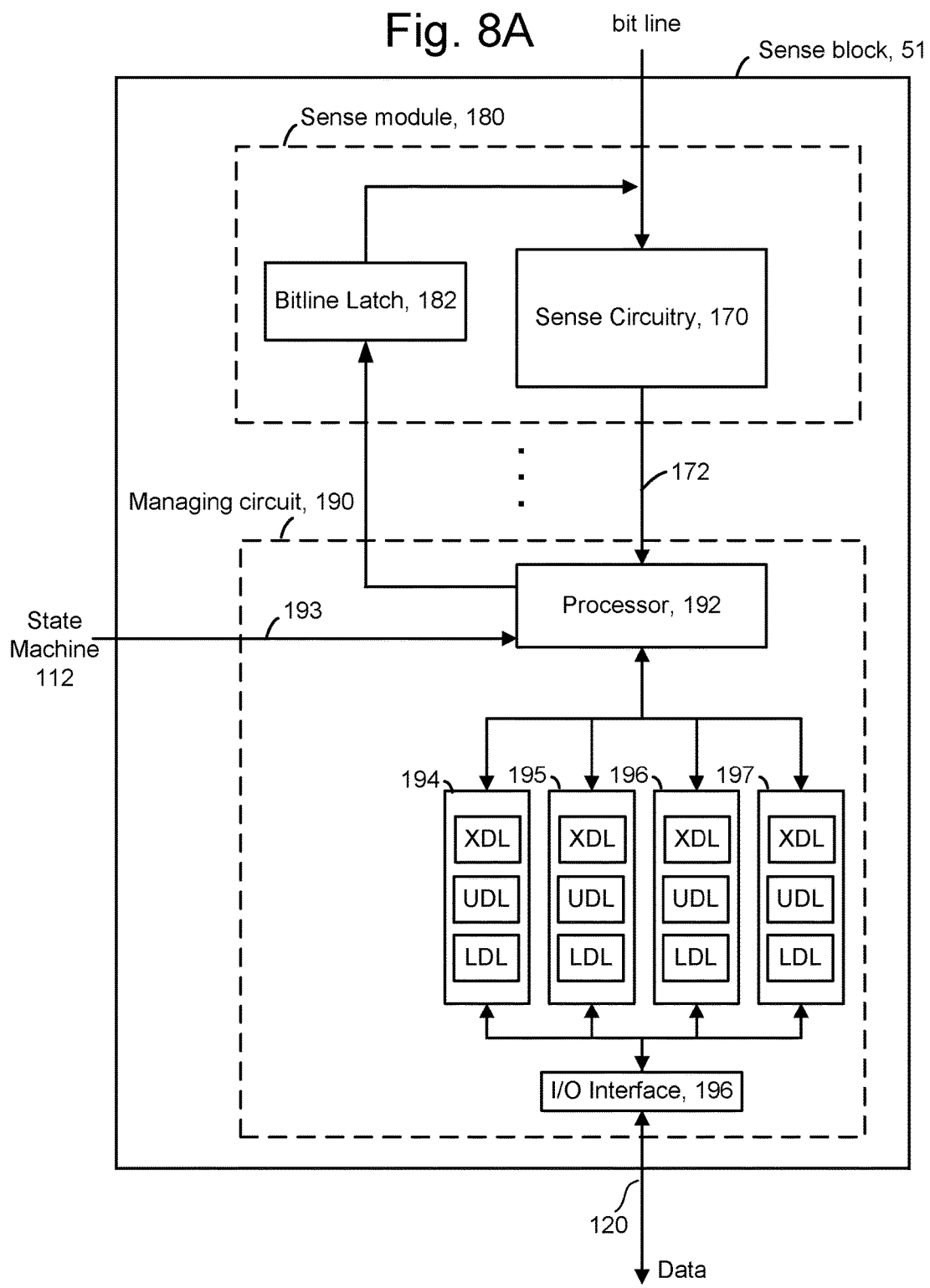

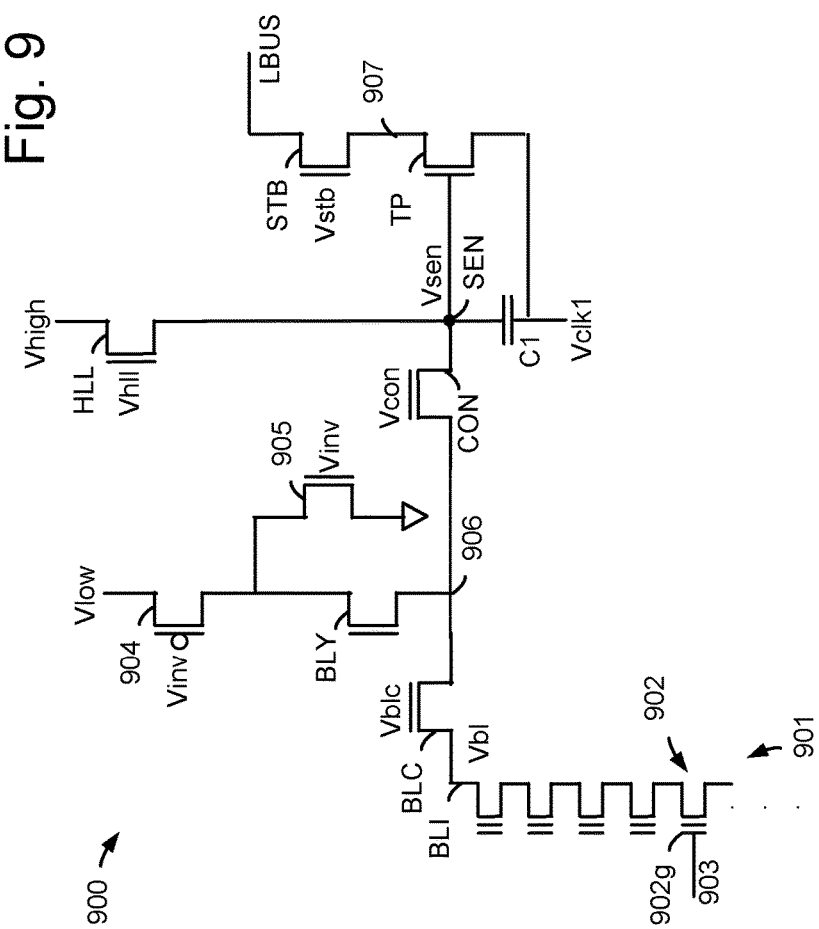

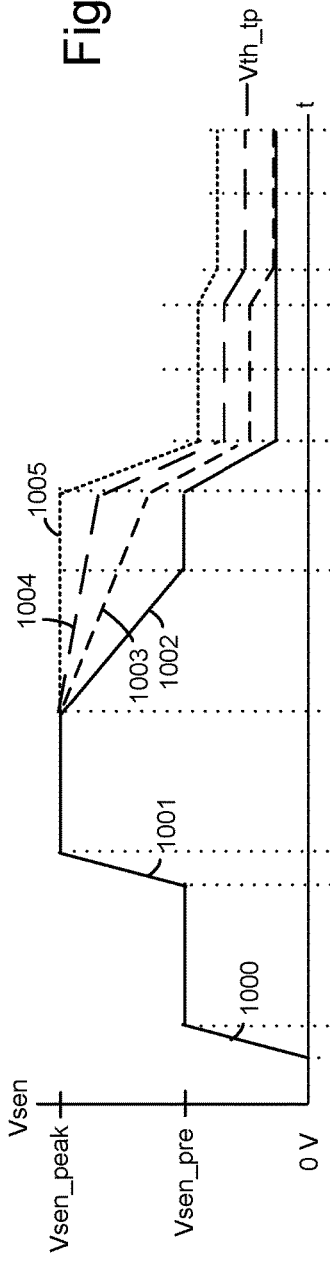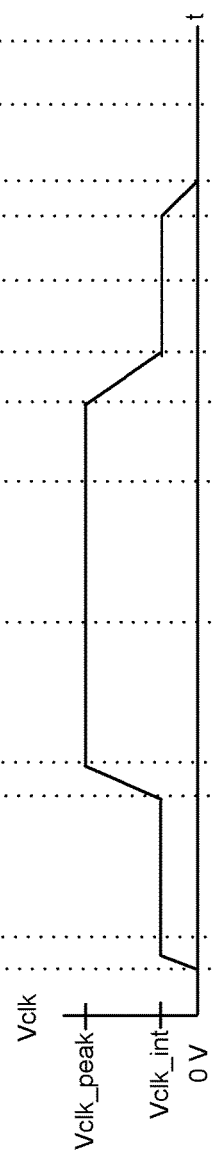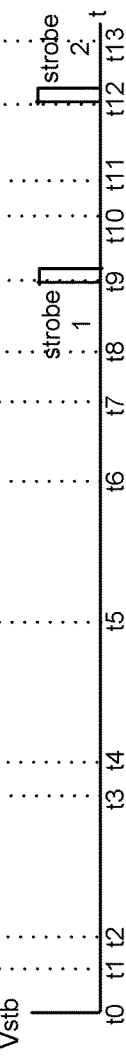

SENSE CIRCUIT WITH TWO-STEP CLOCK SIGNAL FOR CONSECUTIVE SENSING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 4A depicts a threshold voltage (Vth) distribution of a set of memory cells with read and verify voltages, where there are four data states.

FIG. 4B depicts a threshold voltage (Vth) distribution of a set of memory cells with read and verify voltages, where there are eight data states.

FIG. 4C depicts a Vth distribution of a set of memory cells with read voltages, where there are four data states and two read voltages for distinguishing between adjacent data states due to data retention loss.

FIG. 8A depicts another example block diagram of the sense block 51 of FIG. 1.

FIG. 8B depicts example values in data latches during a program operation, consistent with FIGS. 6 and 8A.

FIG. 9 depict an example circuit diagram of a sense circuit, consistent with the sense circuit 170 of FIG. 8.

FIG. 10A depicts an example of the voltage Vsen at the sense node SEN of FIG. 9

FIG. 10B depicts a plot of Vclk, consistent with FIGS. 9 and 10A.

FIG. 10C depicts a plot of Vhll, consistent with FIGS. 9, 10A and 10B.

FIG. 10D depicts a plot of Vcon, consistent with FIGS. 9 and 10A-10B.

FIG. 10E depicts a plot of Vstb, consistent with FIGS. 9 and 10A-10D.

DETAILED DESCRIPTION

Figure 1:
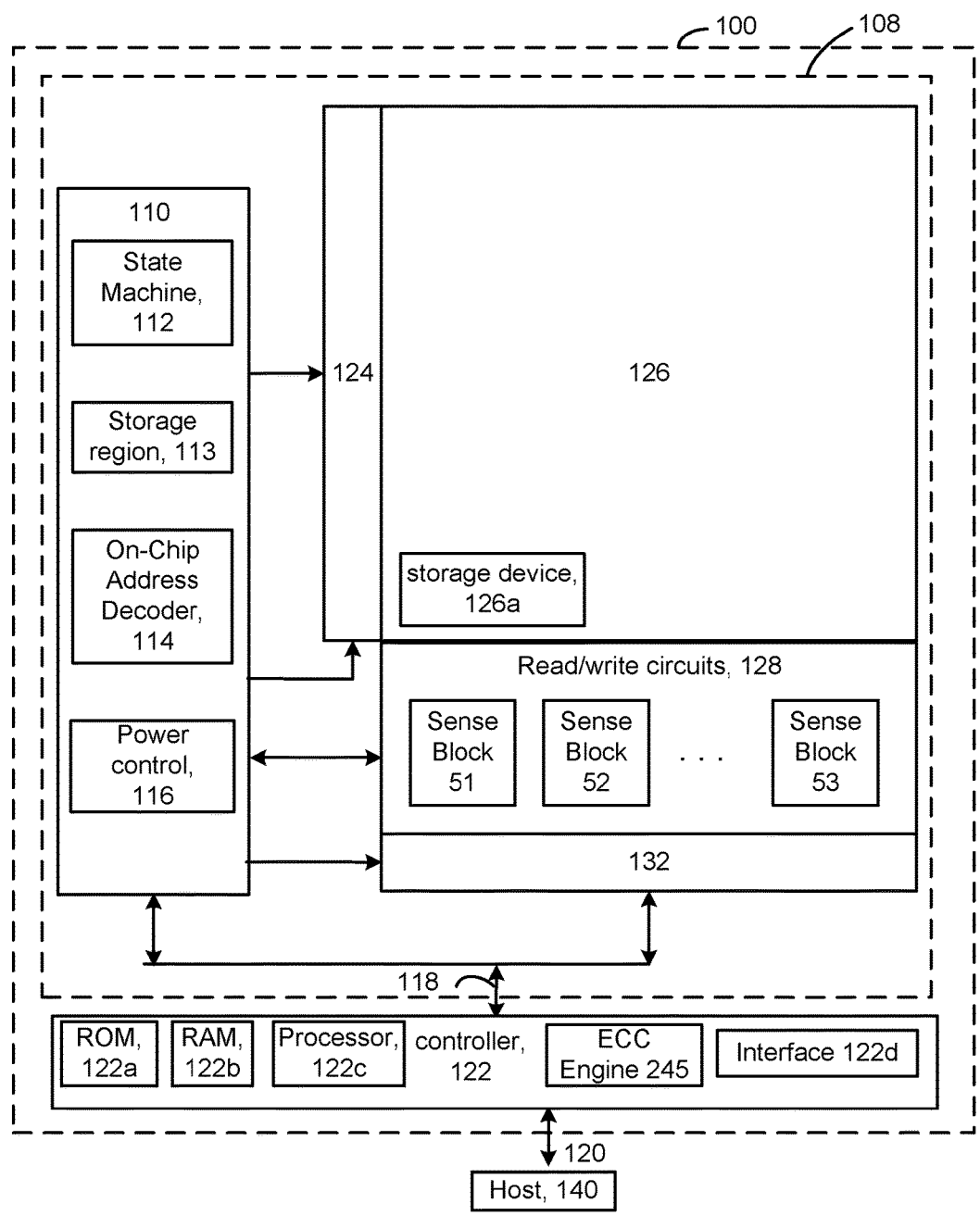
FIG. 1 is a block diagram of an example memory device.

Apparatuses and techniques are described for sensing the conductive state of a memory cell.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C-states (see FIG. 4A). In a three-bit per cell memory device, there are eight data states including the erased state and seven higher data states referred to as the A, B, C, D, E, F and G data states (FIG. 4B). In a four-bit per cell memory device, there are sixteen data states including the erased state and fifteen higher data states.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and can be lower than the final verify voltage. When a memory cell is close to completion of programming, the programming speed of the memory cell can be reduced such as by elevating a voltage of a respective bit line during one or more subsequent program voltages. For example, in FIG. 4A, a memory cell which is to be programmed to the A-state can be subject to verify tests at VvAL, an offset verify voltage of the A-state, and VvAH, a final, higher verify voltage of the A-state.

By slowing the programming speed just before a memory cell completes programming, narrower Vth distributions can be achieved. However, time is consumed in performing the verify operations. For example, typically, a verify test for VvAL in FIG. 4A involves applying VvAL to the control gates of the selected memory cells via a selected word line, pre-charging sense circuits which are connected to the selected memory cells via respective bit lines and observing an amount of discharge in the sense circuits after a specified discharge period. The amount of discharge is observed by determining whether the voltage of a sense node in the sense circuit falls below a trip voltage. If the voltage falls below the trip voltage, this indicates the memory cell is in a conductive state. In other words, the Vth of the memory cell is less than the voltage on the control gate. If the voltage of the sense circuit does not fall below the trip voltage, this indicates the memory cell is in a non-conductive state. In other words, the Vth of the memory cell is greater than the voltage on the control gate.

A verify test for VvAH in FIG. 4A, similarly involves applying VvAH to the selected memory cells, pre-charging the sense circuits and observing an amount of discharge in the sense circuits. The time for the verify operations is therefore doubled when two verify tests are performed sequentially. See also FIG. 5C.

Techniques provided herein address the above and other issues. In one aspect, a sense circuit is provided in which the Vth of a memory cell is sensed relative to two different levels using a single control gate voltage on the memory cell. These two levels can be lower and higher verify voltages of a data state in a programming operation, for instance. In other implementations, the two levels can be read voltages in a read operation. The sense circuit has a sense node which is pre-charged to an intermediate level and then capacitively coupled higher, to a peak level, by increasing a voltage on a capacitor which is connected to the sense node. The sense node is then allowed to discharge into the bit line. After a discharge period, the sense node voltage is capacitively coupled lower by a first decrease of the voltage on the capacitor, and a first strobe process outputs a first bit based on the level of the sense node. The sense node voltage is then capacitively coupled lower by a second decrease of the voltage on the capacitor, and a second strobe process outputs a second bit based on the level of the sense node.

The first and second bits indicate a Vth of a memory cell relative to lower and higher verify voltages, respectively, of an assigned data state to which the memory cell is being programmed.

Performing two strobes after increasing the sense node voltage to a peak level, without a further increase of the sense node voltage, saves time in the sensing operation. Also, performing the strobes after the sense node voltage has been decreased allows the use of a trip point transistor with a lower Vth so that the transistor can be smaller. Further, providing two decreases of the sense node voltages allows the same trip point transistor (a single trip point transistor) to be used to evaluate the Vth of a memory cell relative to two different voltages. The concept can be extend to more than two decreases of the sense node voltages and more than two strobes as well. Moreover, discharging the sense nodes from a higher level allows for a wider variation in the discharge rates so that the sensing is more accurate.

These and other features are discussed herein.

FIG. 1 is a block diagram of an example memory device for implementing apparatuses and techniques for sensing the conductive state of a memory cell. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The temperature-sensing circuit may detect a temperature of the memory device. See FIG. 1B for further details of a temperature-sensing circuit.

The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end or source side of a NAND string, and an SGD transistor is a select gate transistor at a drain-end or drain side of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
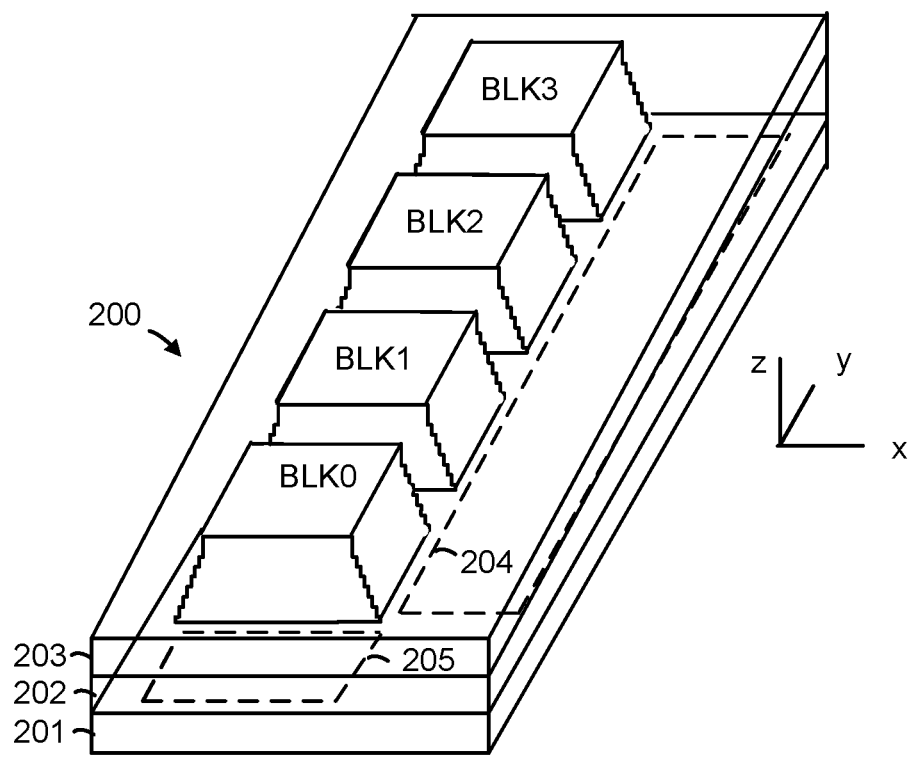
FIG. 2 is a perspective view of a memory device 200 comprising a set of blocks in a plane in an example 3D configuration of the memory structure 126 of FIG. 1.

FIG. 2 is a perspective view of a memory device 200 comprising a set of blocks in a plane in an example 3D configuration of the memory structure 126 of FIG. 1. On the substrate 201 are example blocks BLK0, BLK1, BLK2 and BLK3 of memory cells (storage elements) and peripheral areas with circuitry for use by the blocks. The peripheral area 204 runs along an edge of each block while the peripheral area 205 is at an end of the set of blocks.

The circuitry can include voltage drivers which can be connected to control gate layers, bit lines and source lines of the blocks. The substrate can also carry circuitry under the blocks, with one or more lower metal layers which are patterned in conductive paths to carry signals of the circuitry. The blocks are formed in an intermediate region 202 of the memory device. In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 3A:
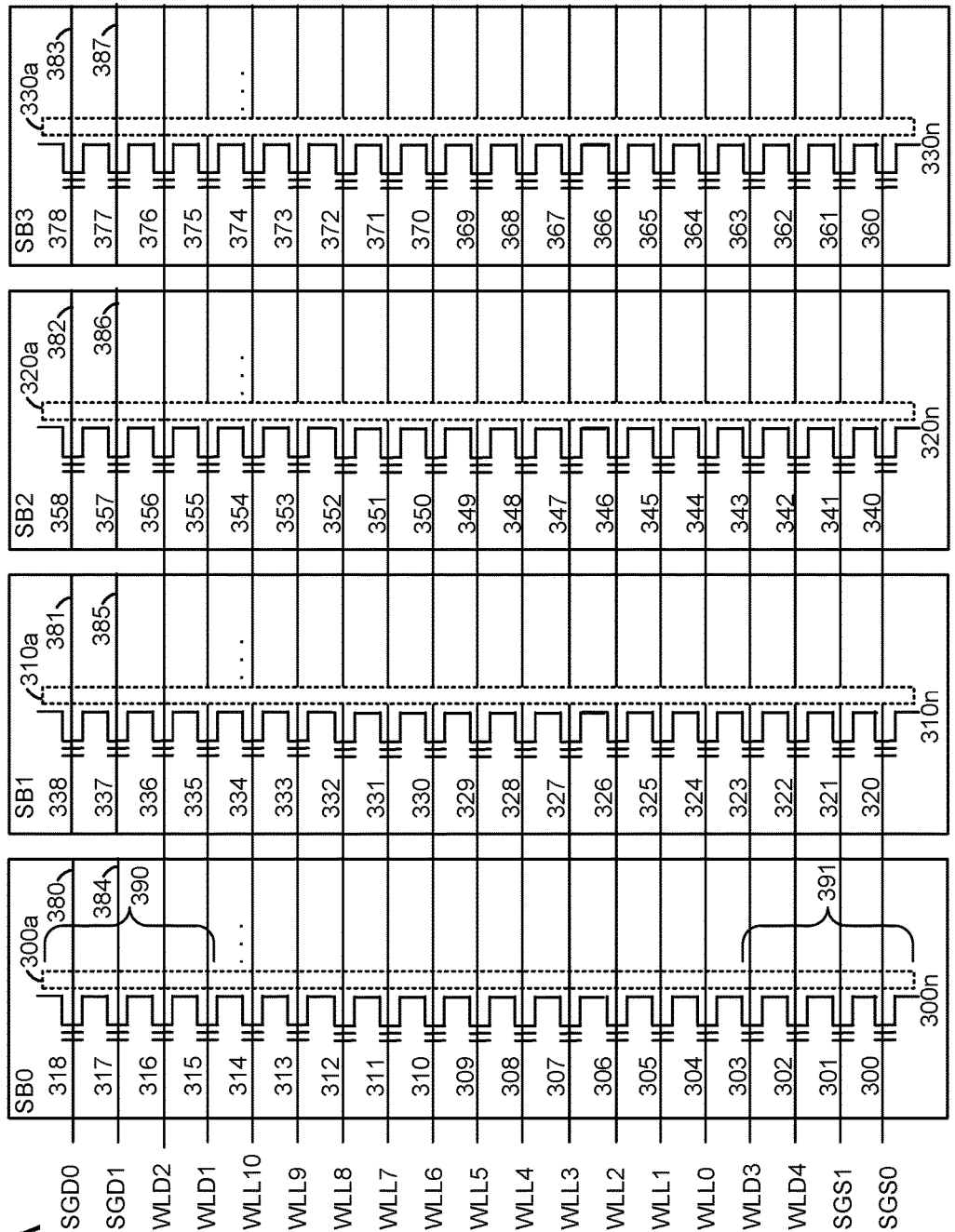
FIG. 3A depicts an example implementation of the memory structure 126 of FIG. 1 comprising NAND strings in sub-blocks in a 3D configuration.

FIG. 3A depicts an example implementation of the memory structure 126 of FIG. 1 comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack. The memory hole is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 300*n*, 310*n*, 320*n* and 330*n*, respectively. The NAND strings have data word lines, dummy word lines and select gate lines. Each sub-block comprises a set of NAND strings which extend in the x direction and which have a common SGD line. SB0 has SGD lines or SGD layer portions 380 and 384 in the SGD0 and SGD1 layers, respectively. SB1 has SGD layer portions 381 and 385 in the SGD0 and SGD1 layers, respectively. SB2 has SGD layer portions 382 and 386 in the SGD0 and SGD1 layers, respectively. SB3 has SGD layer portions 383 and 387 in the SGD0 and SGD1 layers, respectively. Each of the data word line layers WLL0 to WLL10 and the SGS layers SGS0 and SGS1 is shared by all of the sub-blocks SB0 to SB3. The dummy word line layers are also shared by all of the sub-blocks.

The NAND strings 300*n*, 310*n*, 320*n* and 330*n* are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300*n*, 310*n*, 320*n* and 330*n* have channels 300*a*, 310*a*, 320*a* and 330*a*, respectively. Each channel has a drain end and a source end. For example, the channel 300*a* has a drain end 390 and a source end 391.

Additionally, NAND string 300*n* includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310*n* includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320*n* includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330*n* includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

Figure 3B:
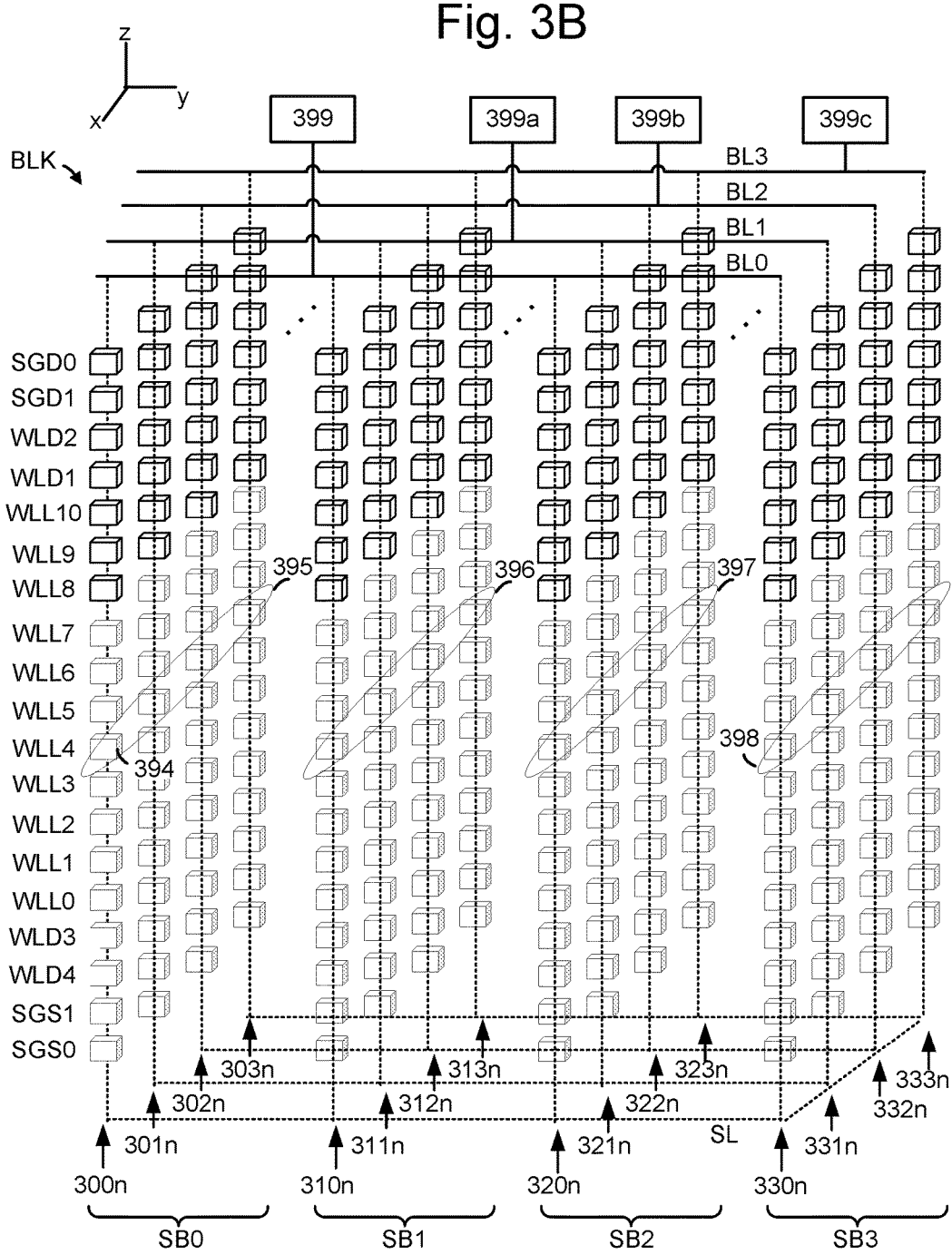
FIG. 3B depicts a perspective view of sub-blocks SB0-SB3 consistent with FIG. 3A.

FIG. 3B depicts a perspective view of sub-blocks SB0-SB3 consistent with FIG. 3A. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 300*n*, 301*n*, 302*n* and 303*n*. SB1 includes NAND strings 310*n*, 311*n*, 312*n* and 313*n*. SB2 includes NAND strings 320*n*, 321*n*, 322*n* and 323*n*. SB3 includes NAND strings 330*n*, 331*n*, 332*n* and 333*n*. Bit lines are connected to sets of NAND strings. For example, a bit line BL0 is connected to NAND strings 300*n*, 310*n*, 320*n* and 330*n*, a bit line BL1 is connected to NAND strings 301*n*, 311*n*, 321*n* and 331*n*, a bit line BL2 is connected to NAND strings 302*n*, 312*n*, 322*n* and 332*n*, and a bit line BL3 is connected to NAND strings 303*n*, 313*n*, 323*n* and 333*n*. A sense circuit may be connected to each bit line. For example, sense circuits 399, 399*a*, 399*b* and 399*c* are connected to bit lines BL0, BL1, BL2 and BL3, respectively. The NAND strings are examples of vertical memory strings which extend upward from a substrate.

Programming and reading can occur for selected cells of one word line and one sub-block at a time. This allows each selected cell to be controlled by a respective bit line. For example, an example set 395 of memory cells (including an example memory cell 394) in SB0 is connected to WLL4. Similarly, the sets 396, 397 and 398 comprise data memory cells in SB1, SB2 and SB3 are connected to WLL4.

FIG. 4A depicts a threshold voltage (Vth) distribution of a set of memory cells with read and verify voltages, where there are four data states. This is an example Vth distribution for implementing apparatuses and techniques for sensing the conductive state of a memory cell. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective final verify voltages of respective data states. All memory cells may initially be in an erased state at the beginning of the programming pass.

Example Vth distributions for the memory cell array are provided for a case where each memory cell stores two bits of data in one of four possible Vth ranges. One bit represents lower page data and the other bit represents the upper page data.

A first Vth distribution 430 is provided for erased (Er) state memory cells. Vth distributions 431, 432 and 433 represent data states A, B and C, respectively, which are reached by memory cells when their Vth exceeds the final verify voltage VvAH, VvBH or VvCH, respectively. VvEr is an erase verify voltage. Additionally, the data states A, B and C have offset verify voltages VvAL, VvBL and VvCL, respectively.

After the programming pass is completed, the data can be read from the memory cells using read voltages VrA, VrB and VrC which are between the Vth distributions. By testing whether the Vth of a given memory cell is above or below one or more of the read voltages, the system can determine the data state which is represented by a memory cell.

The offset verify voltages may be offset from the final verify voltages by a common increment or by different increments. One or more offset or lower verify voltages could be provided for a data state. As mentioned at the outset, to obtain narrow Vth distributions while minimizing a programming time penalty, a slow programming mode may be implemented for a memory cell when its Vth exceeds an offset verify voltage but is still below the final verify voltage of the data state. A slow programming mode may be implemented for a memory cell by raising an associated bit line voltage to a positive value during a program voltage. Prior to the slow programming mode, the memory cell may be in a fast or normal programming mode in which a bit line voltage Vbl=0 V to maximize the programming speed. Thus, the Vth of a memory cell can increase at a relatively fast rate with each program voltage initially in the program operation until the Vth moves closer to the final verify voltage. At this time, the Vth of the memory cell increases at a relatively slow rate with each program voltage so that it does not excessively overshoot the final verify voltage. The memory cell is locked out from further programming when its Vth exceeds the final verify voltage, e.g., by setting Vbl to a high level such as 2-3 V during subsequent program voltages of the program operation.

If multiple offset verify voltages are used, Vbl can be set to one level when the Vth of a memory cell exceeds a first offset verify voltage and to another, higher level when the Vth exceeds a second offset verify voltage which is greater than the first offset verify voltage.

FIG. 4B depicts a threshold voltage (Vth) distribution of a set of memory cells with read and verify voltages, where there are eight data states. This is another example Vth distribution for implementing apparatuses and techniques for sensing the conductive state of a memory cell. A first Vth distribution 410 is provided for erased (Er) state memory cells. Vth distributions 411, 412, 413, 414, 415, 416 and 417 represent data states A, B, C, D, E, F and G, respectively, which are reached by memory cells when their Vth exceeds the final verify voltage VvAH, VvBH, VvCH, VvDH, VvEH, VvFH and VvGH, respectively. Additionally, the data states A, B, C, D, E, F and G and C have the offset verify voltages VvAL, VvBL, VvCL, VvDL, VvEL, VvFL and VvGL, respectively. The parentheses 420-426 identify verify levels which are tested concurrently in a common/single sensing operation using the techniques provided herein. For example, the parentheses 420, 421, 422, 423, 424, 425 and 426 indicate that VvAL and VvAH, VvBL and VvBH, VvCL and VvCH, VvDL and VvDH, VvEL and VvEH, VvFL and VvFH and VvGL and VvGH, respectively, are tested concurrently.

The notation VL and VH and may be used herein to represent the lower and higher verify levels, respectively, of a data state, or, generally, two read voltages of a data state. For example, in FIG. 4A, VL can represent VvAL, VvBL or VvCL and VH can represent VvAH, VvBH or VvCH. VH and VL also represent first and second voltages, respectively.

FIG. 4C depicts a Vth distribution of a set of memory cells with read voltages, where there are four data states and two read voltages for distinguishing between adjacent data states due to data retention loss. The Vth distribution 450 represents the erased state, and the Vth distributions 451, 452 and 453 represent the A, B and C states, respectively, just after programming, when there is little or no data retention loss. The Vth distributions 451a, 452a and 453a represent the A, B and C states, respectively, when there is significant data retention loss. Data retention loss occurs when charges leave the charge trapping layer of a memory cell and therefore causes a decrease in the Vth of the programmed cells. When a set of cells is being read, the amount of data retention loss is not known. Accordingly, one approach is to read the cells using one set of read voltages (e.g., VrAL, VrBL and VrCL) which are optimized for data retention loss and another set of read voltages (e.g., VrAH, VrBH and VrCH) which are optimized for little or no data retention loss. An optimized read voltage can be positioned midway between the upper tail of a Vth distribution of one data state and the lower tail of a Vth distribution of another, adjacent data state. The two read results can be analyzed such as by determining which results in the least number of errors according to an ECC code and the best result selected. The techniques provided herein allow for sensing of the Vth of a cell relative to two different levels. See also FIG. 5D.

In yet another example, the cells are read using voltages which do not distinguish between data states but may serve a purpose such as measuring the size and shape of the Vth distribution.

Figure 5A:
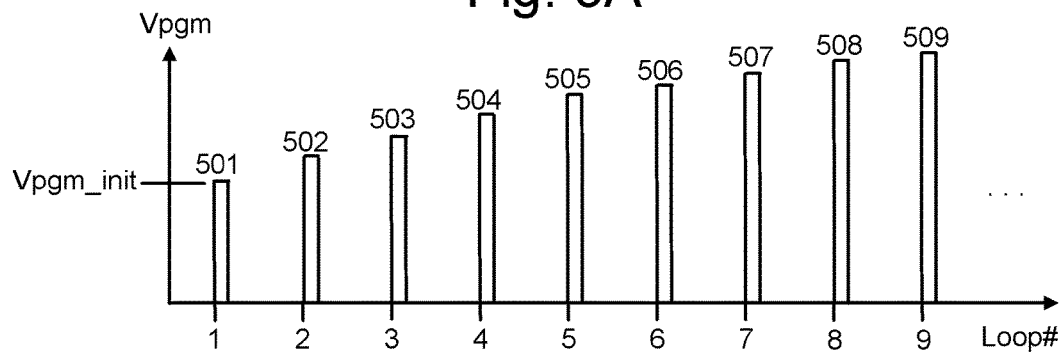
FIG. 5A depicts a set of program voltages in an example program operation.

FIG. 5A depicts a set of program voltages in an example program operation. This is an example of a program operation in which the conductive state of a memory cell is sensed. The vertical axis depicts Vpgm, a control gate or word line voltage, and the horizontal axis depicts time or program loop number (e.g., program-verify iteration number). A one pass program operation with four data states is depicted. Other options are possible. The program operation comprises a series of program voltages 501-509. Incremental step pulse programming is performed, such that Vpgm begins at an initial level, Vpgm_init and increases step-wise in each program loop. This example also performs verify tests based on the program loop (see FIGS. 5B and 5C). For example, the A-state cells are verified in loops 1 and 2, the A and B-state cells are verified in loops 3-5, the B and C-state cells are verified in loops 6-8 and the C-state cells are verified in loop 9. The horizontal axes of FIG. 5A-5C are time-aligned.

Figure 5B:
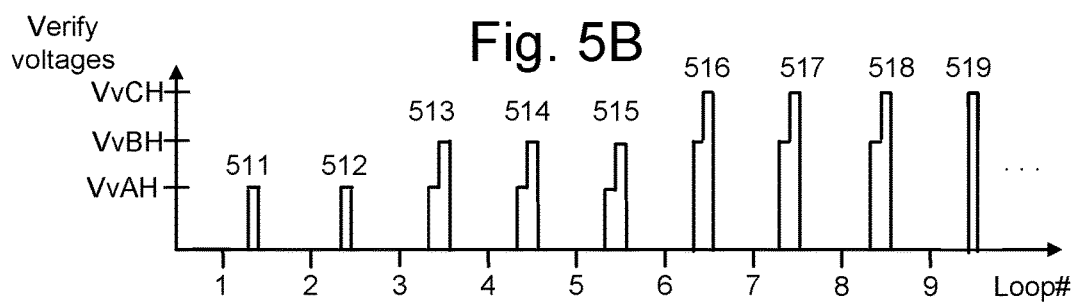
FIG. 5B depicts verify voltages which can be used in the program operation of FIG. 5A, where a single verify voltage is used for each data state to perform verify tests at the offset and final verify voltages for each data state.

FIG. 5B depicts verify voltages which can be used in the program operation of FIG. 5A, where a single verify voltage is used for each data state to perform verify tests at the offset and final verify voltages for each data state. Waveforms 511 and 512 in program loops 1 and 2, respectively, have a magnitude of VvAH. Waveforms 513, 514 and 515 in program loops 3, 4 and 5, respectively, have a magnitude of VvAH and VvBH. Waveforms 516, 517 and 518 in program loops 6, 7 and 8, respectively, have a magnitude of VvBH and VvCH. Waveform 519 in program loop 9 has a magnitude of VvCH. Advantageously, two (or more) verify tests can be performed for the memory cells of a selected word line while one control gate voltage is applied to the word line. For example, in program loops 1 and 2, verify tests at VvAL and VvAH can be performed for the A-state cells using the control gate voltage of VvAH. In program loops 3, 4 and 5, verify tests at VvAL and VvAH can be performed for the A-state cells using the control gate voltage of VvAH, and verify tests at VvBL and VvBH can be performed for the B-state cells using the control gate voltage of VvBH.

In program loops 6, 7 and 8, verify tests at VvBL and VvBH can be performed for the B-state cells using the control gate voltage of VvBH, and verify tests at VvCL and VvCH can be performed for the C-state cells using the control gate voltage of VvCH. In program loop 9, verify tests at VvCL and VvCH can be performed for the C-state cells using the control gate voltage of VvCH. The control gate voltages could alternatively be a voltage other than the higher, final verify voltage of VvAH, VvBH or VvCH.

Figure 5C:
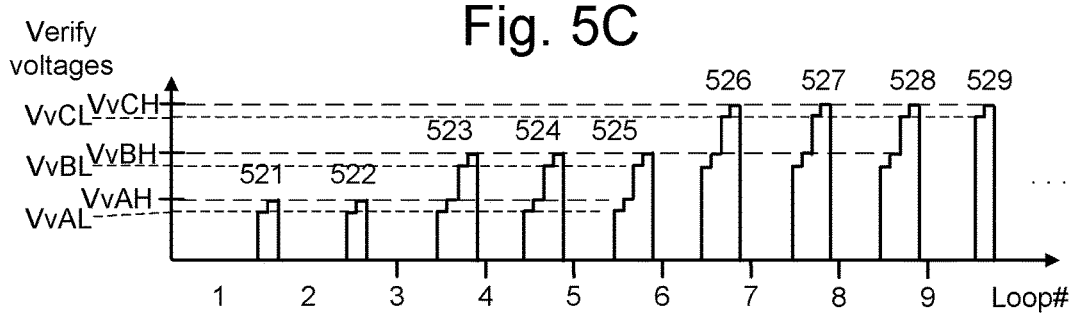
FIG. 5C depicts verify voltages which can be used in the program operation of FIG. 5A, where multiple verify voltages are used for each data state to perform verify tests at the offset and final verify voltages for each data state.

FIG. 5C depicts verify voltages which can be used in the program operation of FIG. 5A, where multiple verify voltages are used for each data state to perform verify tests at the offset and final verify voltages for each data state. This provides a comparative example relative to FIG. 5B. This approach results in an increased program time due to the time needed to apply separate control gate voltages to the selected word line for each verify test. Waveforms 521 and 522 in program loops 1 and 2, respectively, have magnitudes of VvAL and VvAH. Waveforms 523, 524 and 525 in program loops 3, 4 and 5, respectively, have magnitudes of VvAL, VvAH, VvBL and VvBH. Waveforms 526, 527 and 528 in program loops 6, 7 and 8, respectively, have magnitudes of VvBL, VvBH, VvCL and VvCH. Waveform 529 in program loop 9 has magnitudes of VvCL and VvCH.

Figure 5D:
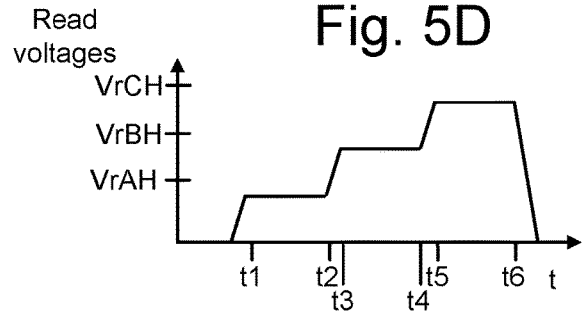
FIG. 5D depicts example read voltages, consistent with the Vth distribution of FIG. 4C.

FIG. 5D depicts example read voltages, consistent with the Vth distribution of FIG. 4C. The voltage waveform has three levels, VrAH, VrBH and VrCH, which are fixed control gate (word line) voltages which are applied in first, second and third sensing periods, respectively, from t1-t2, t3-t4 and t5-t6, respectively. Also, in this example, the Vth of the cell is compared to VrAH and VrAL, VrBH and VrBL, and VrCH and VrCL, respectively, in the first, second and third sensing periods. Thus, the Vth of the cell is compared to the control gate voltage and to a voltage below the control gate voltage, in each sensing period. However, other approaches are possible. For example, the Vth of the cell could be compared to VrAH and VrAL, VrBH and VrBL, and VrCH and VrCL, respectively, in the first, second and third sensing periods, when VrAL, VrBL and VrCL are the control gate voltages, respectively, in the first, second and third sensing periods. In yet another approach, the Vth of the cell could be compared to VrAH and VrAL, VrBH and VrBL, and VrCH and VrCL, respectively, in the first, second and third sensing periods, when some other control gate voltages (other than VrAH or VrAL, VrBH or VrBL, and VrCH or VrCL, respectively) are applied in the first, second and third sensing periods, respectively. Generally, the Vth of a cell can be compared to a first voltage and then a second voltage which is less than the first voltage.

Figure 6A:
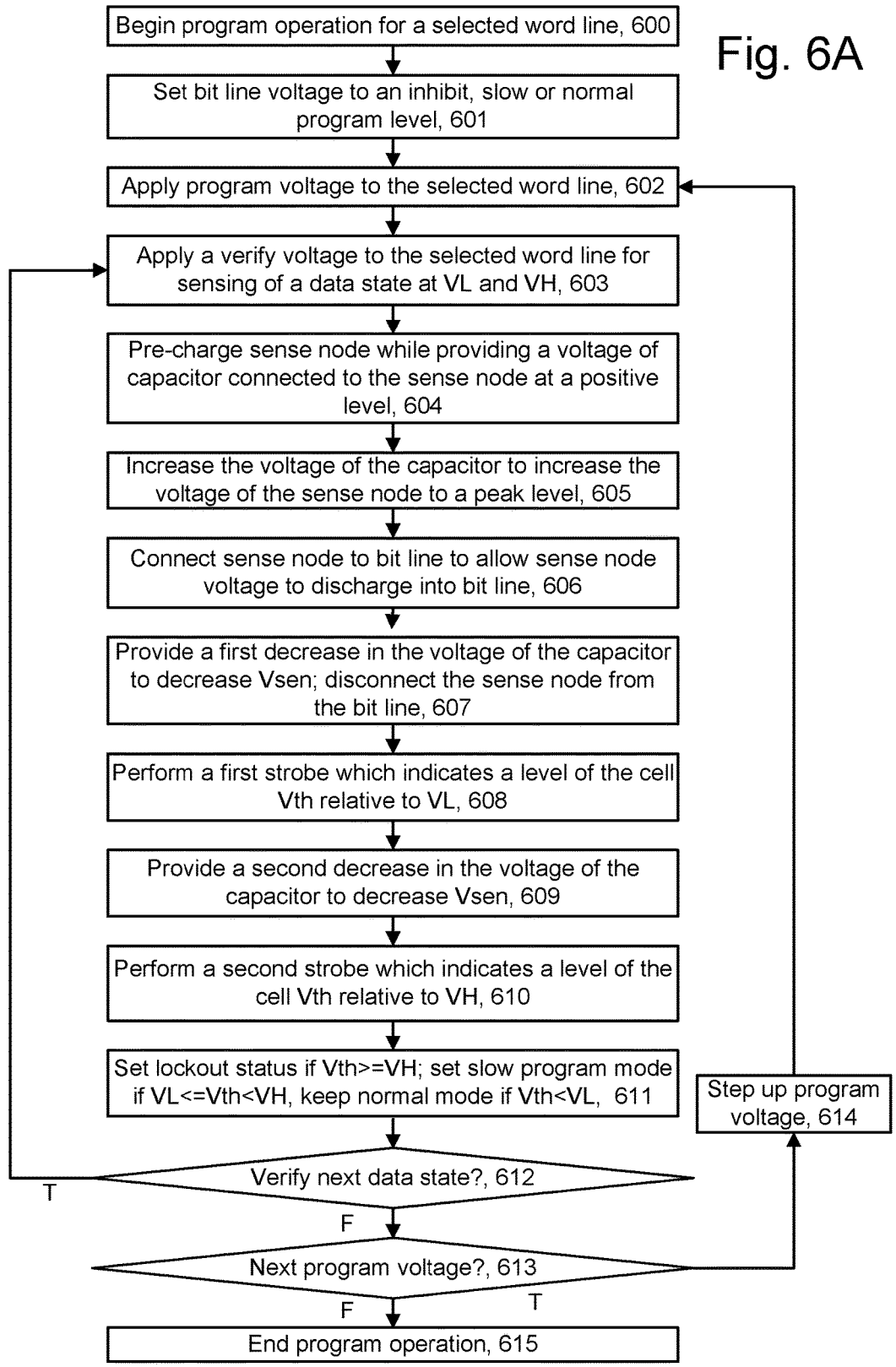
FIG. 6A depicts an example programming process consistent with FIGS. 5A and 5B.

FIG. 6A depicts an example programming process consistent with FIGS. 5A and 5B. The process can be implemented, e.g., using the components of the memory device 100 of FIG. 1, including any of the control circuits in FIG. 1 such as the control circuitry 110 and controller 122, the sense circuits, caches and the sense circuit controller of FIG. 7, the sense block of 51 of FIG. 8A, the sense circuit 900 of FIG. 9, and the decoders, voltage drivers, switches and pass transistors of FIG. 11. Step 600 begins a program operation for a selected word line and the selected memory cells connected to it. Step 601 includes setting a bit line voltage to an inhibit, slow or normal programming level. As mentioned, a cell can be initially programmed in a normal, fast mode (with Vbl=0 V) until its Vth exceeds the lower verify level VL of its target data state. The cell can then be programmed in a slow mode (with Vbl=1 V, for instance) until its Vth exceeds the higher verify level VH of its target data state. Subsequently, the cell is locked out or inhibited from further programming (using Vbl=2-3 V, for instance). A latch can be used to store data indicating the mode for the current program loop. See also FIG. 8B.

A lockout state is also set in the data state latches for the sense circuits of memory cells which are to remain in the erased state. For the sense circuits of memory cells which are to be programmed to a particular data state, the data state latches are set to identify the particular data state.

Step 602 involves applying a program voltage to a selected word line. See FIG. 5A and the initial program voltage, Vpgm_int, for example. Step 603 involves applying a verify voltage (a fixed control gate voltage) to the selected word line for sensing of a data state at the lower and higher verify voltages, VL and VH, respectively. For example, see the verify voltages of FIG. 5B. The fixed control gate voltage can be applied at least during the discharge period. Step 604 involves pre-charging the sense node of the sense circuit while providing a voltage of a capacitor connected to the sense node at a positive voltage. For example, see SEN and C1 in FIG. 9 and Vclk in FIG. 10B at t1-t3. Step 605 includes increasing the voltage of the capacitor to increase Vsen, e.g., by way of capacitive coupling, to a peak level. For example, see C1 in FIG. 9 and Vclk in FIG. 10B at t3-t4. Step 606 includes connecting the sense node to the bit line to allow the sense node voltage to discharge into the bit line. See the CON transistor in FIG. 9 and Vcon at FIG. 10D at t5.

Step 607 includes providing a first decrease in the voltage of the capacitor to decrease Vsen, e.g., by way of capacitive coupling. See Vclk in FIG. 10B at t7-t8. In one possible approach, the decease is equal to the increase at t3-t4. This step also includes disconnecting the sense node from the bit line. See Vcon at FIG. 10D at t7.

Step 608 includes performing a first strobe which indicates a level of the cell Vth relative to a first voltage, VL. Step 609 includes providing a second decrease in the voltage of the capacitor to decrease Vsen further, e.g., by way of capacitive coupling. See Vclk in FIG. 10B at t10-t11. Step 610 includes performing a second strobe which indicates a level of the cell Vth relative to a second voltage VH, which is greater than VL. Performing a strobe can involve reading out a bit of data from the sense circuit, where the bit is based on an analog voltage of the sense node. For example, see STB in FIG. 9 and Vstb in FIG. 10E, including strobe 1 and 2. In the example of FIG. 10E, the strobe which indicates a level of the cell Vth relative to VL (strobe 1, a first strobe) occurs before the strobe which indicates a level of the cell Vth relative to VH (strobe 2, a second strobe).

Step 611 includes setting a lockout status if Vth>=VH or a slow program mode if VL<=Vth<VH such as by updating values in latches associated with the memory cell. A third option is keeping the normal mode if Vth<VL, in which case the latches are not updated.

A decision step 612 determines whether there is a next data state which is subject to a verify test. If decision step 612 is true, the process continues at step 603, where a next verify voltage is applied to the selected word line. If decision step 612 is false, a decision step 613 determines whether there is a next program voltage to apply in the program operation. Typically, a next program voltage is applied until all, or nearly all, of the memory cells which are being programmed have passed the verify test at the final verify voltage. However, a fail status may be set for the program operation if a maximum allowable number of program voltages have been applied before all, or nearly all, of the memory cells which are being programmed have passed the verify test at the final verify voltage.

If decision step 613 is true, the process continues at step 614 where the program voltage is stepped up, and at step 601 where the bit line voltage is set and for the next program loop. If decision step 613 is false, the program operation ends at step 615.

Figure 6B:
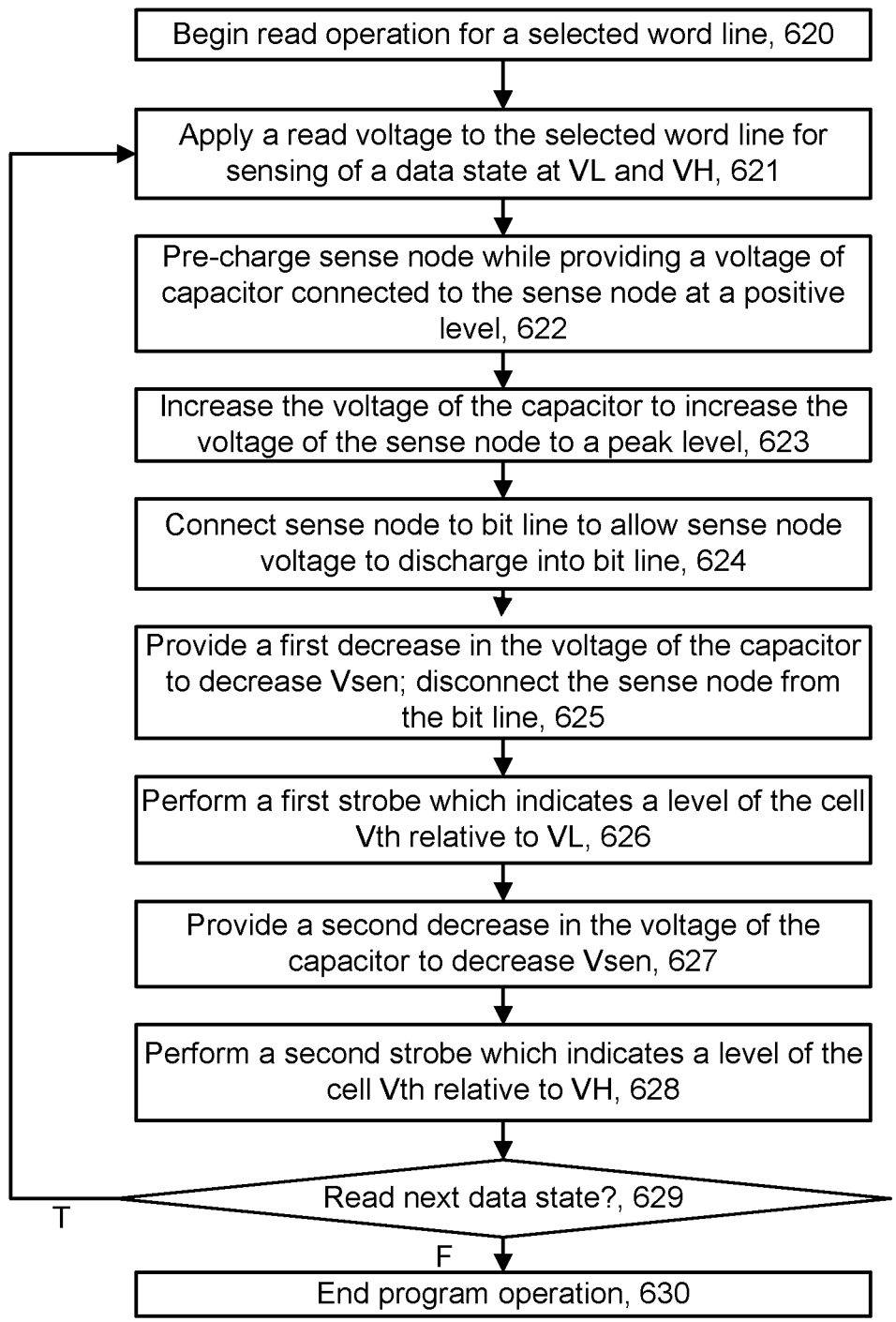
FIG. 6B depicts an example read process consistent with FIG. 5D.

FIG. 6B depicts an example read process consistent with FIG. 5D. The process can be implemented, e.g., using the components of the memory device 100 of FIG. 1, including any of the control circuits in FIG. 1 such as the control circuitry 110 and controller 122, the sense circuits, caches and the sense circuit controller of FIG. 7, the sense block of 51 of FIG. 8A, the sense circuit 900 of FIG. 9, and the decoders, voltage drivers, switches and pass transistors of FIG. 11.

Step 620 begins a read operation for a selected word line and the selected memory cells connected to it. Step 621 involves applying a read voltage to a selected word line for sensing of a data state at VL and VH, respectively. For example, VL and VH may be the voltage VrAL and VrAH, respectively, in the first pass through step 621. Steps 622-628 are similar to steps 604-610, respectively, discussed previously. Step 622 involves pre-charging the sense node of the sense circuit while providing a voltage of a capacitor connected to the sense node at a positive voltage. Step 623 includes increasing the voltage of the capacitor to increase Vsen, e.g., by way of capacitive coupling, to a peak level. Step 624 includes connecting the sense node to the bit line to allow the sense node voltage to discharge into the bit line. Step 625 includes providing a first decrease in the voltage of the capacitor to decrease Vsen, e.g., by way of capacitive coupling.

Step 626 includes performing a first strobe which indicates a level of the cell Vth relative to a first voltage, VL. Step 627 includes providing a second decrease in the voltage of the capacitor to decrease Vsen further, e.g., by way of capacitive coupling. Step 628 includes performing a second strobe which indicates a level of the cell Vth relative to a second voltage VH, which is greater than VL.

A decision step 629 determines whether there is a next data state to read. If the decision step is true, the process continues at step 621, where a next read voltage is applied to the selected word line. For example, VrBH could be applied in a second pass through step 621. VrCH could be applied in a third pass through step 621. If the decision step is false, the read operation ends at step 630.

Figure 7:
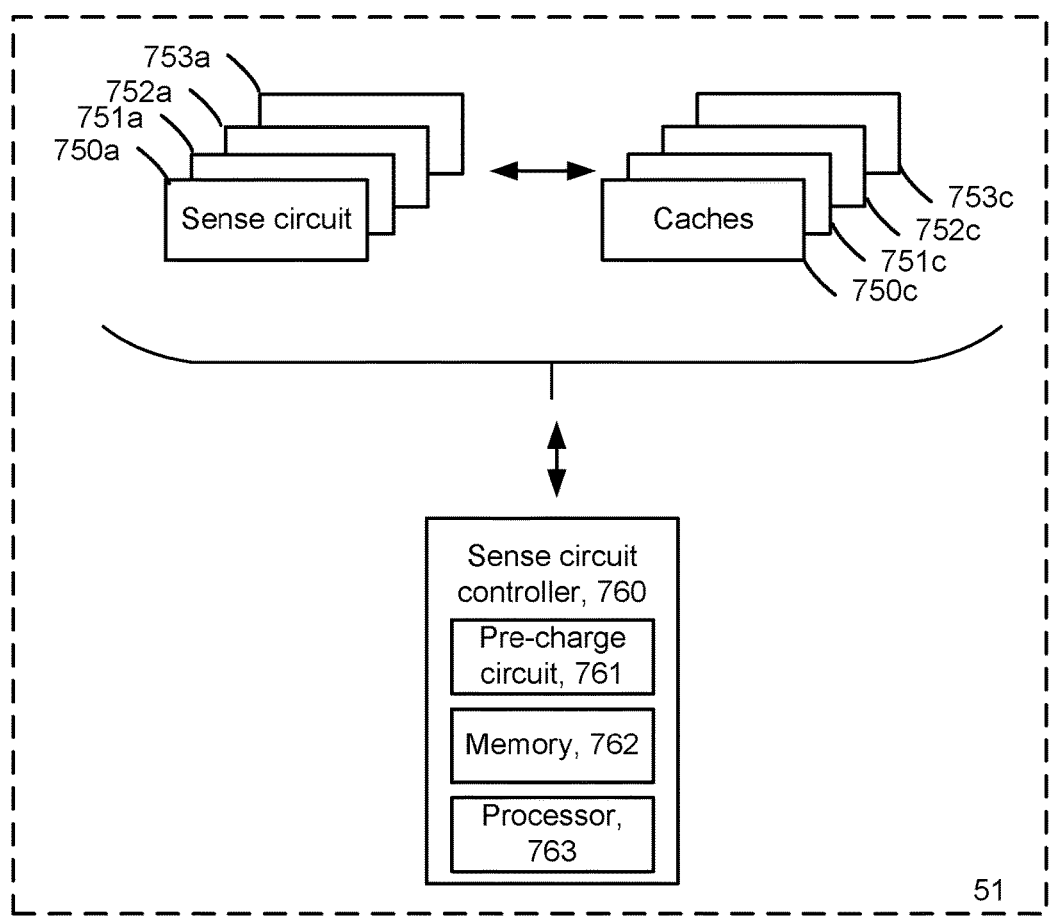
FIG. 7 depicts an example block diagram of the sense block 51 of FIG. 1.

FIG. 7 depicts an example block diagram of the sense block 51 of FIG. 1. The column control circuitry can include multiple sense blocks, where each sense block performs sensing, e.g., read, program-verify or erase-verify operations for multiple memory cells via respective bit lines. In one approach, a sense block comprises multiple sense circuits, also referred to as sense amplifiers. Each sense circuit is associated with data latches and caches. For example, the example sense circuits 750a, 751a, 752a and 753a are associated with caches 750c, 751c, 752c and 753c, respectively.

In one approach, different subsets of bit lines can be sensed using different respective sense blocks. This allows the processing load which is associated with the sense circuits to be divided up and handled by a respective processor in each sense block. For example, a sense circuit controller 760 can communicate with the set, e.g., sixteen, of sense circuits and latches. The sense circuit controller may include a pre-charge circuit 761 which provides a voltage to each sense circuit for setting a pre-charge voltage. The sense circuit controller may also include a memory 762 and a processor 763.

Further example details of the sense circuits are provided below.

FIG. 8A depicts another example block diagram of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 2-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by XDL, LDL and UDL may be provided for each set. In some cases, additional data latches may be used. XDL is an offset verify latch which stores a bit indicating whether the slow programming mode is in effect. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

FIG. 8B depicts example values in data latches during a program operation, consistent with FIGS. 6 and 8A. The data latches includes an offset verify latch 800 (XDL), an upper page latch 801 and (UDL) a lower page latch 802 (UDL), and are associated with one memory line. A bit combination in a set of latches may be written with the lower page bit followed by the upper page bit, followed by the offset verify bit. Er is the erased state, which has the same bit combination (111) as the inhibit/lockout states Ainh, Binh, Cinh. The bits under A, B, and C are for a cell which is to be programmed to the A, B or C data state, respectively, and which has not locked out and is not in the slow programming mode. The cell is in normal programming mode. The bits under Aslow, Bslow and Cslow are for a cell which is to be programmed to the A, B or C data state, respectively, and is in the slow programming mode (and thus not locked out).

For example, during programming, the latches of an A data state cell would transition from 100 to 101 to 111, the latches of a B data state cell would transition from 000 to 001 to 111, and the latches of a C data state cell would transition from 010 to 011 to 111.

FIG. 9 depict an example circuit diagram of a sense circuit 900, consistent with the sense circuit 170 of FIG. 8. An example memory string 901 is connected to a path BLI in the circuit. The memory string includes an example selected memory cell 902 comprising a control gate 902g connected to a selected word line 903. A verify or read voltage is applied to the selected word line while the remaining, unselected word line may receive a higher pass voltage which places the associated memory cells in a strongly conductive state. This allows the Vth of the selected memory cell to be accurately sensed.

In a sensing operation, initially, the bit line BLI and sense node SEN are pre-charged. BLI is pre-charged via transistors BLY (an nMOS transistor, for instance) and 904 (a pMOS transistor, for instance) via a node 906. BLY is a pre-charge transistor. A relatively low voltage, Vlow, such as 2 V may be passed to the bit line. A discharge transistor 905 (an nMOS transistor, for instance) is also provided. When a voltage Vinv goes high, the transistor 905 is opened (made conductive), the transistor 904 is closed (made non-conductive) and the path between BLY and transistor 904 is grounded. When Vinv goes low, the transistor 905 is closed, the transistor 904 is opened and the bit line is pre-charged. The bit line clamp (BLC) transistor is also opened at this time. BLC is set at a level which clamps the bit line voltage. It acts as source follower by setting its source voltage, e.g., the bit line voltage Vbl, based on Vblc minus Vth of the BLC transistor.

The sense node SEN is pre-charged by a relatively high voltage, Vhigh, e.g., 4 V, via a transistor HLL (an nMOS transistor, for instance). Vhll is set high to allow this pre-charge. A bit line connect transistor CON remains non-conductive to isolate SEN from the bit line. SEN is connected to a capacitor C1 and to the control gate of a trip point transistor TP. The capacitors can be provided in any format, including a metal capacitor and a MOS (metal-oxide-semiconductor) capacitor.

After the bit line and sense node have been pre-charged, a discharge period is implemented in which CON is opened, allowing SEN to discharge into the bit line.

At the end of the discharge period, the voltage of the sense node is decreased a first time by way of capacitive coupling by decreasing Vclk a first time. The level of SEN is then evaluated and converted to a binary value which is output from the sense circuit in the first strobe process. The first strobe process raises Vstb to provide the strobe transistor STB in a conductive state. This passes the level on node 907, the source of TP, to a bus, LBUS for output to the sense circuit controller or other managing circuit. If this level is relatively low, it is interpreted by the controller as one bit value and if it is relatively high, it is interpreted by the controller as another bit value. TP has a threshold voltage Vth which is used to determine whether SEN is in conductive or non-conductive state after SEN discharges. If Vsen is relatively low, e.g., less than Vth, representing a relatively large discharge and a relatively highly conductive state of the memory cell, TP will allow relatively little current to flow on its source to STB. If Vsen is relatively high, e.g., greater than Vth, representing a relatively small discharge and a relatively weakly conductive state of the memory cell, TP will allow a relatively larger amount of current to flow on its source to STB.

Subsequently, the voltage of the sense node is decreased a second time by way of capacitive coupling by decreasing Vclk a second time. The level of SEN is then evaluated and converted to a binary value which is output from the sense circuit in a second strobe process. The second strobe process raises Vstb again to provide the strobe transistor STB in a conductive state. Advantageously, the same strobe transistor and trip point transistor can be used to provide both of the strobe outputs.

Current can flow from a drain to the source of TP based on the voltage Vclk.

Based on the two bits from STB, the Vth of the cell can be determined. In one implementation, the first bit indicates the Vth of the cell relative to the verify low voltage VL, e.g., whether Vth>=VL or Vth<VL and the second bit indicates the Vth of the cell relative to the verify high voltage VH, e.g., whether Vth>=VH or Vth<VH. Generally, a larger discharge of the sense node is associated with a higher control gate voltage, a lower Vth of a cell, and a longer discharge period. The second decrease of Vsen corresponds to a larger discharge of the sense node, and this in turn corresponds to a higher control gate voltage. This is why the second strobe, after the second decrease of Vsen, corresponds to comparing the Vth of the cell to VH and why the first strobe, after the first decrease of Vsen, corresponds to comparing the Vth of the cell to VL.

The cell can then be programmed in a next program loop using the normal or slow mode or inhibited from further programming, as discussed. In one approach, the sense circuit controller or processor 192 evaluates the bits and updates the latches accordingly or each selected memory cell.

FIG. 10A depicts an example of the voltage Vsen at the sense node SEN of FIG. 9. The sense node is at 0 V from t0-t1. A pre-charge process occurs from t1-t3 where the sense node is charged up to Vsen_pre (plot 1000). Vhll goes high at this time as shown by FIG. 10C so that SEN is driven at Vsen_pre. FIG. 10C depicts a plot of Vhll, consistent with FIGS. 9, 10A and 10B. The sense node is boosted higher, to a peak level of Vsen_peak at t3-t4 when the clock signal Vclk increases from Vclk_int to Vclk_peak as shown by FIG. 10B (see also plot 1001 in FIG. 10A). This second increase in Vsen uses capacitive coupling from the capacitor C1. The increase in Vsen1 (Vsen_peak−Vsen_pre) is based on (Vclk_peak−Vclk_int)×CR, where CR is a coupling ratio between the capacitor and the sense node. A discharge period extends from t5-t7, when Vcon goes high as shown by FIG. 10D. FIG. 10D depicts a plot of Vcon, consistent with FIGS. 9 and 10A-10B.

When Vcon goes high, the bit line connect transistor CON becomes conductive, allowing SEN to discharge into the bit line. This discharge can occur because Vsen_peak is greater than the bit line pre-charge level, Vlow. Vsen will decrease at a rate which is based on the rate of discharge. Four examples are provided. A plot 1005 corresponds to the case where the cell is strongly non-conductive so that the discharge is essentially zero. A plot 1004 corresponds to the case where the cell is less strongly non-conductive so that the discharge is minimal and due mainly to leakage from the sense node. A plot 1003 corresponds to the case where the cell is on the border between being conductive and non-conductive so that the discharge is moderate. A plot 1002 corresponds to the case where the cell is strongly conductive so that the discharge is relatively large. The plot 1002 reaches a floor level of Vsen_pre in this example at t6-t7. This voltage floor may be greater than a maximum level of the voltage of the sense node after the first decrease of the voltage of the sense node (plot 1005 at t8-t10). The voltage floor may be set by a voltage floor transistor BLY. BLY and transistor 904 provide a voltage to the node 906 which biases the BLC transistor.

Vclk is decreased or stepped down a first time at t7-t8 so that Vsen is also decreased or stepped down correspondingly by way of capacitive coupling (FIG. 10A). At t8-t10, Vsen will have a level based on the amount of discharge, and this analog level is converted to a digital bit during a first strobe process, e.g., at t9 as shown by FIG. 10E. FIG. 10E depicts a plot of Vstb, consistent with FIGS. 9 and 10A-10D.

Vclk is decreased a second time at t10411 so that Vsen is also decreased correspondingly by way of capacitive coupling (FIG. 10A). At t11-t13, Vsen will have a level based on the amount of discharge, and this analog level is converted to a digital bit during a second strobe process, e.g., at t12 as shown by FIG. 10E. Note that the plots 1002 and 1003 begin to coincide at t11-t13. This is acceptable because the initial sensing (first strobe) is relative to VL. If the cell is highly conductive compared to VL (e.g., its Vth<VL) in the initial sensing, it will be even more highly conductive relative to VH (since VH>VL). Accordingly, the discharge rates can be configured to provide a greater margin or range to distinguish among the cells which may be only slight conductive, or non-conductive, relative to VH in the second strobe. Thus, the discharge rate for the cells which are strong conductive relative to VL can be combined into the discharge rate for the cells which are less strongly conductive relative to VL.

FIG. 10E depicts a plot of Vstb, consistent with FIGS. 9 and 10A-10D.

The trip point transistor TP has a threshold voltage Vth_tp (FIG. 10A), and the strobe of the output of the trip point transistor indicates the voltage of the sense node Vsen relative to the Vth of the trip point transistor. Vth_tp is a reference voltage to which the sense node voltage is compared. In one approach, the sense circuit outputs an analog voltage on the bus LBUS to the sense circuit controller. This analog voltage is based on the voltage at the source of the TP transistor which, in turn, is based on the sense node voltage. If the analog voltage is above the reference voltage, the controller will assign one bit value (0 or 1) to represent the sense node voltage. If the analog voltage is below the reference voltage, the controller will assign another bit value (0 or 1) to represent the sense node voltage.

The sense node controller therefore evaluates the voltage of the sense node relative to a reference voltage and, based on the evaluating (a first evaluating), provides a first bit which indicates whether the voltage of the sense node exceeds the reference voltage. This is done after the first decrease of the sense node voltage due to the first decrease of Vclk. Subsequently, the sense node controller again evaluates the voltage of the sense node and, based on the again evaluating (a second evaluating), provides a second bit which indicates whether the voltage of the sense node exceeds the reference voltage. As an example, the first and second bits can be 0 if the analog voltage which is evaluated is above the reference voltage or 1 if the analog voltage which is evaluated is not above the reference voltage. The Vth of the memory cell which is sensed can then be classified by the sense circuit controller into one of three bins. A first bin represent Vth<VL, a second bin represents VL<=Vth<VH, and a third bin represents Vth>=VH.

For example, in the first evaluating, a first bit of 0 indicates the analog voltage is above the reference voltage, so there is a small sense node discharge and the Vth of the memory cell is above VL. A first bit of 1 indicates the analog voltage is below the reference voltage, so there is a large sense node discharge and the Vth of the memory cell is below VL. In the second evaluating, a first bit of 0 indicates the analog voltage is above the reference voltage, so there is a small sense node discharge and the Vth of the memory cell is above VH. A first bit of 1 indicates the analog voltage is below the reference voltage, so there is a large sense node discharge and the Vth of the memory cell is below VH. With first bit=1 and second bit=1, the cell is in the first bin. With first bit=0 and second bit=1, the cell is in the second bin. With first bit=0 and second bit=0, the cell is in the third bin.

FIG. 10B depicts a plot of Vclk, consistent with FIGS. 9 and 10A. Vclk is initially at 0 V, for instance, from t0-t1. From t1-t2, Vclk is increased to a positive, intermediate level, Vclk_pre, such as 0.5-1 V. Vclk is held at this positive level during the pre-charge of SEN which occurs via the HLL transistor. SEN is not coupled up by the increase in Vclk because it is driven at this time. From t3-t4, Vclk is increased (e.g., stepped up) to a peak level, Vclk_peak, such as 2 V and held at this level until t7. From t7-t8, Vclk is decreased (e.g., stepped down) a first time, to Vclk_int or other intermediate level (between Vclk_peak and 0 V) and held at this level until t10. From t10-t11, Vclk is decreased a second time, to 0 V or other initial level, for instance and held at this level until t13, at the end of the sensing operation.

Further, in the example shown, there is a single pre-charge of the sense nodes in a sense operation so no additional time is needed for multiple pre-charges. Instead, a control circuit is configured to keep the bit line connect transistor closed after the discharge period t4-t11 until an end of the sense operation at t15. The sense node is not charged again after the voltage of the sense node reaches the peak level at t4 and before the second strobe of the output at t12. The sensing time is also reduced because a single control gate voltage can be used for the memory cells. The sense operation can comprise a verify or read operation.

The sense circuit described herein could be extended to more than two sense nodes as well to sense a memory cell relative to more than two Vth levels.

Figure 11:
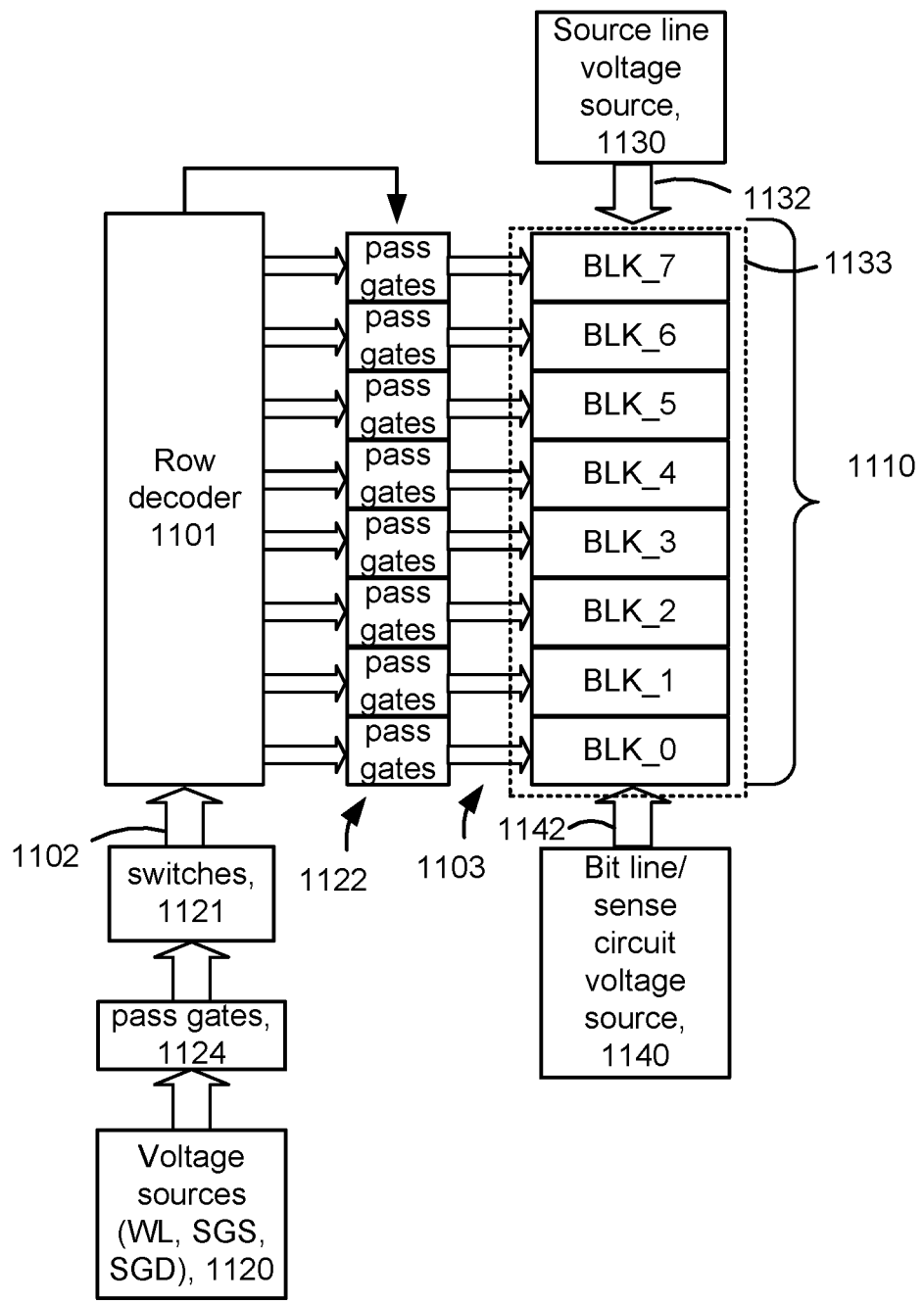
FIG. 11 depicts an example circuit for providing voltages to blocks of memory cells.

FIG. 11 depicts an example circuit for providing voltages to blocks of memory cells. In this example, a row decoder 1101 provides voltages to word lines and select gates of each block in set of blocks 1110. The set could be in a plane and includes blocks BLK0 to BLK7, for instance. The row decoder provides a control signal to pass gates 1122 which connect the blocks to the row decoder. Typically, operations, e.g., program, read or erase, are performed on one selected block at a time. The row decoder can connect global control lines 1102 to local control lines 1103. The control lines represent conductive paths. Voltages are provided on the global control lines from voltage sources 1120. The voltage sources may provide voltages to switches 1121 which connect to the global control lines. Pass gates 1124, also referred to as pass transistors or transfer transistors, are controlled to pass voltages from the voltage sources 1120 to the switches 1121.

The voltage sources 1120 can provided voltages on data and dummy word lines (WL) and dummy word line portions, SGS layers and SGD layer portions, for example.

The various components, including the row decoder, may receive commands from a controller such as the state machine 112 or the controller 122 to perform the functions described herein.

A source line voltage source 1130 provides a voltage to the source lines/diffusion region in the substrate via control lines 1132. In one approach, the source diffusion region 1133 is common to the blocks. A set of bit lines 1142 is also shared by the blocks. A bit line/sense circuit voltage source 1140 provides voltages to the bit lines and sense circuits.

In one embodiment, an apparatus comprises: a sense node; a bit line connect transistor between the sense node and a bit line; a capacitor connected to the sense node; a trip point transistor connected to the sense node; and a control circuit. The control circuit, to perform a sense operation for a memory cell connected to the bit line, is configured to: increase a voltage of the capacitor which steps up a voltage of the sense node to a peak level by way of capacitive coupling, open the bit line connect transistor in a discharge period, provide a first decrease of the voltage of the capacitor which provides a first decrease of the voltage of the sense node, perform a first strobe of an output of the trip point transistor after the first decrease of the voltage of the capacitor, provide a second decrease of the voltage of the capacitor which provides a second decrease of the voltage of the sense node, and perform a second strobe of the output of the trip point transistor after the second decrease of the voltage of the sense node In another embodiment, a method comprises: stepping up a voltage of a sense node to a peak level; connecting the sense node to a memory cell during a discharge period; after the discharge period, evaluating the voltage of the sense node relative to a reference voltage and, based on the evaluating, providing a first bit which indicates whether the voltage of the sense node exceeds the reference voltage; after the providing the first bit, stepping down the voltage of the sense node, again evaluating the voltage of the sense node and, based on the again evaluating, providing a second bit which indicates whether the voltage of the sense node exceeds the reference voltage.

In another embodiment, an apparatus comprises: means for charging up a voltage of a sense node to an initial level; means for connecting the sense node to a memory cell during a discharge period; means for initially lowering the voltage of the sense node after the discharge period; means for evaluating the voltage of the sense node after the first time period; means for further lowering the voltage of the sense node after the initially lowering the voltage; and means for evaluating the voltage of the sense node after the further lowering the voltage.

The means described above can include the components of the memory device 100 of FIG. 1, including any of the control circuits in FIG. 1 such as the control circuitry 110 and controller 122, the sense circuits, caches and the sense circuit controller of FIG. 7, the sense block of 51 of FIG. 8A, the sense circuit 900 of FIG. 9, and the decoders, voltage drivers, switches and pass transistors of FIG. 11. For example, the means for charging up the sense nodes can include the power control module 116 of FIG. 1, the pre-charge circuit 761 of FIG. 7, and the HLL transistor in FIG. 9 under the control of the circuitry 110, the controller 122 and the sense circuit controller 760.

The means for discharging can include the CON transistor of FIG. 9 under the control of the circuitry 110, the controller 122 and the sense circuit controller 760.

The means for providing data can include the TP and STB transistors of FIG. 9, under the control of the circuitry 110, the controller 122 and the sense circuit controller 760.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a sense node;
a first transistor between the sense node and a bit line;
a capacitor connected to the sense node;
a second transistor connected to the sense node; and
a control circuit, the control circuit to perform a sense operation for a memory cell connected to the bit line, is configured to:
  increase a voltage of the capacitor which steps up a voltage of the sense node to a peak level by way of capacitive coupling,
  provide the first transistor in a conductive state to connect the sense node with the bit line in a discharge period,
  provide a first decrease of the voltage of the capacitor which provides a first decrease of the voltage of the sense node,
  perform a first strobe of an output of the second transistor after the first decrease of the voltage of the capacitor,
  provide a second decrease of the voltage of the capacitor which provides a second decrease of the voltage of the sense node, and
  perform a second strobe of the output of the second transistor after the second decrease of the voltage of the sense node.

2. The apparatus of claim 1, further comprising:
a third transistor connected to the sense node, wherein the control circuit is configured to provide the third transistor in a conductive state to pre-charge the sense node prior to the increase of the voltage of the capacitor.

3. The apparatus of claim 2, wherein:
the control circuit is configured to provide the voltage of the capacitor at a positive level during the pre-charge of the sense node; and
the second decrease of the voltage of the capacitor is to a level below the positive level.

4. The apparatus of claim 1, wherein:
the sense node is not charged again after the voltage of the sense node reaches the peak level and before the second strobe of the output.

5. The apparatus of claim 1, wherein:
the discharge period ends no later than a time of the first decrease of the voltage of the capacitor; and
the control circuit is configured to keep the first transistor in a non-conductive state after the discharge period until after the second strobe of the output.

6. The apparatus of claim 1, wherein:
the first strobe of the output indicates a threshold voltage of the memory cell relative to a first voltage (VL); and
the second strobe of the output indicates a threshold voltage of the memory cell relative to a second voltage (VH) which is greater than the first voltage.

7. The apparatus of claim 6, wherein:
the control circuit is configured to apply a fixed control gate voltage to the memory cell during the discharge period.

8. The apparatus of claim 7, wherein:
the fixed control gate voltage is equal to the first voltage or the second voltage.

9. The apparatus of claim 1, wherein:
the sense operation comprises a verify or read operation.

10. The apparatus of claim 1, wherein:
the second transistor has a threshold voltage;
the first strobe of the output indicates the voltage of the sense node relative to the threshold voltage of the second transistor after the first decrease of the voltage of the sense node but before the second decrease of the voltage of the sense node; and
the second strobe of the output indicates the voltage of the sense node relative to the threshold voltage of the second transistor after the second decrease of the voltage of the sense node.

11. The apparatus of claim 1, wherein:
a control gate of the second transistor is connected to the sense node; and
the output of the second transistor comprises a source of the of the second transistor.

12. The apparatus of claim 1, further comprising:
a third transistor between the first transistor and the bit line; and
wherein the third transistor is configured to set a floor for the voltage of the sense node during the discharge period before the first decrease of the voltage of the sense node.

13. The apparatus of claim 1, wherein:
the sense node discharges into the bit line during the discharge period.

14. The apparatus of claim 1, wherein:
the output of the second transistor after the first decrease of the voltage of the capacitor indicates whether the voltage of the sense node is greater than or less than a threshold voltage of the second transistor; and
the output of the second transistor after the second decrease of the voltage of the capacitor indicates whether the voltage of the sense node is greater than or less than the threshold voltage of the second transistor.

15. An apparatus, comprising:
a sense node;
a bit line connect transistor, the bit line connect transistor configured to connect the sense node with a bit line;
a capacitor connected to the sense node;
a trip point transistor, the trip point transistor comprising a control gate connected to the sense node, a drain and a source; and a control circuit, the control circuit, to perform a sense operation for a memory cell connected to the bit line, is configured to:
  increase a voltage of the capacitor which steps up a voltage of the sense node to a peak level by way of capacitive coupling,
  provide the bit line connect transistor in a conductive state to connect the sense node with the bit line in a discharge period,
  provide a first decrease of the voltage of the capacitor which provides a first decrease of the voltage of the sense node,
  perform a first strobe which outputs a level of the source of the trip point transistor after the first decrease of the voltage of the capacitor,
  provide a second decrease of the voltage of the capacitor which provides a second decrease of the voltage of the sense node, and
  perform a second strobe which outputs a level of the source of the trip point transistor after the second decrease of the voltage of the sense node.

16. The apparatus of claim 15, wherein:
the level of the source of the trip point transistor after the first decrease of the voltage of the capacitor indicates whether the voltage of the sense node is greater than or less than a threshold voltage of the trip point transistor; and
the level of the source of the trip point transistor after the second decrease of the voltage of the capacitor indicates whether the voltage of the sense node is greater than or less than the threshold voltage of the trip point transistor.

17. The apparatus of claim 15, wherein:
the control circuit is configured to apply a fixed control gate voltage to the memory cell during the discharge period;
the first strobe indicates a threshold voltage of the memory cell relative to a first voltage (VL); and
the second strobe indicates a threshold voltage of the memory cell relative to a second voltage (VH) which is greater than the first voltage.

18. A system, comprising:
a memory die comprising a set of memory cells, bit lines connected to the memory cells, sense circuits connected to the bit lines, and circuitry connected to the set of memory cells and to the sense circuits, each sense circuit comprising a sense node, a capacitor connected the sense node and a transistor comprising a control gate connected to the sense node; and
a controller connected to the memory die, the controller configured to issue a program command;
the circuitry configured to, in response to the program command, apply a program voltage and then a verify voltage to the set of memory cells;
the circuitry configured to sense threshold voltages of the set of memory cells relative to a first voltage and a second voltage while the verify voltage is applied to the set of memory cells; and
to sense the threshold voltages of the set of memory cells, the circuitry is configured to, for each sense circuit:
  discharge the sense node into a respective bit line;
  increase a voltage of the capacitor to increase a voltage of the sense node to a peak level by way of capacitive coupling,
  provide a first decrease of the voltage of the capacitor which provides a first decrease of the voltage of the sense node,
  perform a first strobe which outputs a level of a source of the transistor after the first decrease of the voltage of the capacitor,
  provide a second decrease of the voltage of the capacitor which provides a second decrease of the voltage of the sense node, and
  perform a second strobe which outputs a level of the source of the transistor after the second decrease of the voltage of the sense node.

19. The apparatus of claim 18, wherein, for each sense circuit:
the level of the source of the transistor after the first decrease of the voltage of the capacitor indicates whether the voltage of the sense node is greater than or less than a threshold voltage of the transistor; and
the level of the source of the transistor after the second decrease of the voltage of the capacitor indicates whether the voltage of the sense node is greater than or less than the threshold voltage of the transistor.

20. The apparatus of claim 18, wherein, for each sense circuit:
the first strobe indicates a threshold voltage of a respective memory cell relative to a first voltage; and
the second strobe indicates a threshold voltage of the respective memory cell relative to a second voltage which is greater than the first voltage.

* * * * *